United States Patent
Ohmi et al.

(10) Patent No.: US 7,923,819 B2
(45) Date of Patent: Apr. 12, 2011

(54) INTERLAYER INSULATING FILM, WIRING STRUCTURE AND ELECTRONIC DEVICE AND METHODS OF MANUFACTURING THE SAME

(75) Inventors: Tadahiro Ohmi, Miyagi (JP); Seiji Yasuda, Miyagi (JP); Atsutoshi Inokuchi, Yamanashi (JP); Takaaki Matsuoka, Miyagi (JP); Kohei Kawamura, Yamanashi (JP)

(73) Assignees: National Iniversity Corporation Tohoku University, Miyagi (JP); Tokyo Electron Limited, Tokyo (JP)

( * ) Notice: Subject to any disclaimer, the term of this patent is extended or adjusted under 35 U.S.C. 154(b) by 67 days.

(21) Appl. No.: 12/514,173

(22) PCT Filed: Nov. 8, 2007

(86) PCT No.: PCT/JP2007/071734
§ 371 (c)(1),
(2), (4) Date: May 8, 2009

(87) PCT Pub. No.: WO2008/056748
PCT Pub. Date: May 15, 2008

(65) Prior Publication Data
US 2010/0032844 A1 Feb. 11, 2010

(30) Foreign Application Priority Data
Nov. 9, 2006 (JP) .................................. 2006-304534
Feb. 19, 2007 (JP) .................................. 2007-038584

(51) Int. Cl.
*H01L 23/58* (2006.01)
(52) U.S. Cl. ........................................ 257/632; 257/750
(58) Field of Classification Search .................. 257/758, 257/750, 632, E51.038, E23.03, E23.17
See application file for complete search history.

(56) References Cited

U.S. PATENT DOCUMENTS

| | | | |
|---|---|---|---|
| 6,720,659 B1 | 4/2004 | Akahori | |
| 2003/0094698 A1* | 5/2003 | Jiwari et al. | 257/758 |
| 2004/0164418 A1* | 8/2004 | Sugiura et al. | 257/758 |
| 2005/0023694 A1* | 2/2005 | Bjorkman et al. | 257/758 |
| 2005/0186801 A1* | 8/2005 | Uno et al. | 438/706 |
| 2008/0254641 A1* | 10/2008 | Kobayashi et al. | 438/763 |

FOREIGN PATENT DOCUMENTS

| | | |
|---|---|---|
| JP | 11-330075 A | 11/1999 |
| JP | 2002-220668 A | 8/2002 |
| JP | 2006-128591 A | 5/2006 |
| WO | 2005-069367 A1 | 7/2005 |

OTHER PUBLICATIONS

International Search Report for PCT/JP2007/071734 dated Feb. 12, 2008.

* cited by examiner

*Primary Examiner* — Sheila V Clark
(74) *Attorney, Agent, or Firm* — Pearne & Gordon LLP

(57) ABSTRACT

A wiring structure of a semiconductor device or the like includes an interlayer insulating film having a fluorocarbon film formed on an underlayer, and a conductor buried in the interlayer insulating film. The fluorocarbon film contains nitrogen and is low in dielectric constant, excellent in reproducibility and stable.

16 Claims, 17 Drawing Sheets

200mTorr NF₃ 0cc
×100000

400mTorr NF3 0cc
×100000

200mTorr NF₃ 7cc
×100000

400mTorr NF3 7cc
×100000

INTERLAYER INSULATING FILM, WIRING STRUCTURE AND ELECTRONIC DEVICE AND METHODS OF MANUFACTURING THE SAME

TECHNICAL FIELD

This invention relates to a multilayer wiring or interconnection structure, particularly a structure of an interlayer insulating film, of a board or substrate, such as a semiconductor element, a semiconductor-chip mounting board or a wiring board, and further relates to a semiconductor device having the multilayer wiring structure, a wiring board having the multilayer wiring structure, and an electronic device including the same. This invention also relates to a method of manufacturing the multilayer wiring structure and methods of manufacturing the semiconductor device having the multilayer wiring structure, the wiring board having the multilayer wiring structure, and the electronic device including the same.

BACKGROUND ART

Heretofore, an interlayer insulating film is formed for the purpose of insulation between wiring layers in a multilayer wiring structure on a semiconductor substrate or the like.

In the above-mentioned multilayer wiring structure, a problem of signal delay due to a parasitic capacitance between wirings and a wiring resistance has becomes unavoidable. It is therefore required to use an interlayer insulating film having a low dielectric constant (Low-k).

In a semiconductor device according to the related art, an interlayer insulating film structure is formed on a semiconductor substrate provided with a number of semiconductor elements. The interlayer insulating film structure comprises a barrier cap layer of silicon carbide (SiC) or the like, a carbon-containing silicon oxide (SiOC) film formed on the barrier cap layer, a via hole formed in the SiOC film, a PAR (low-dielectric-constant silicon (Si)) layer, a trench formed in the PAR layer, and a hard mask of silicon oxide ($SiO_2$) covering them. A metal such as copper (Cu) is filled in the via hole to form an electrode or a wiring. At an upper end of the via hole, Cu or the like is filled in the trench to form a wiring.

As the above-mentioned interlayer insulating film, attention has been paid to a fluorocarbon film (hereinafter referred to as a CFx film) which has a dielectric constant k as very low as about 2.5 so that the parasitic capacitance between wirings can be reduced. However, the CFx film is very weak against water and poor in adhesion. Therefore, the CFx film is formed on a base layer or an underlayer, such as a silicon carbonitride (SiCN) layer, a silicon nitride (SiN) layer, an $SiO_2$ layer, or a SiC layer.

Heretofore, the CFx film is formed, for example, by the use of a plasma processing apparatus using a plasma-generating gas, such as He, Ne, Ar, Xe, or Kr, and using a fluorocarbon gas (hereinafter referred to as a CFx gas, e.g. a $C_5F_8$ gas), as described in Patent Document 1. In Patent Document 1, in order to adjust an electron density of generated plasma, $N_2$, $H_2$, or $NH_2$ is used as a diluent gas in combination with the rare gas. Consequently, good adhesion and an excellent film shape are obtained.

[Patent Document 1] JP-A-2002-220668

DISCLOSURE OF THE INVENTION

Problem to be Solved by the Invention

On the other hand, in a wiring structure on the semiconductor element, in particular, in a wiring structure including an interlayer insulating film, it is required to further decrease the dielectric constant. However, no proposal has been made about further decrease of the dielectric constant of the CFx film as the interlayer insulating film. Also, in case where the CFx film is used as the interlayer insulating film, it is desired to improve other electric characteristics of the CFx film, in particular, to improve a dielectric breakdown voltage and to reduce a leak current.

It is therefore a technical object of this invention to provide an interlayer insulating film of a semiconductor device or the like, which is low in dielectric constant, excellent in reproducibility, and stable, and a wiring structure having the same.

It is another technical object of this invention to provide methods of manufacturing the interlayer insulating film and the wiring structure.

Means to Solve the Problem

In order to solve the above-mentioned problem, this invention has been made based on a novel finding as follows. In an interlayer insulating film, for example, by including nitrogen in a fluorocarbon film formed on an underlayer of a semiconductor substrate, it is possible to lower a dielectric constant k, to improve a dielectric breakdown voltage, and to reduce a leak current.

According to an aspect of this invention, there is provided an interlayer insulating film comprising an underlayer, and a fluorocarbon film which is formed on the underlayer and which contains nitrogen.

According to another aspect of this invention, there is provided a multilayer wiring structure comprising the interlayer insulating film described above, at least one of a via and a trench formed in the interlayer insulating film, a conductor layer buried in at least one of the via and the trench, and a barrier layer formed around the conductor layer.

According to still another aspect of this invention, there is provided a method of manufacturing an interlayer insulating film. The method comprises forming an underlayer and forming the interlayer insulating film comprising a fluorocarbon film so that nitrogen is included in the fluorocarbon film.

According to another aspect of this invention, there is provided a method of manufacturing a multilayer wiring structure, comprising forming an underlayer, forming on the underlayer an interlayer insulating film which includes a plurality of fluorocarbon films, and burying a metal conductor into the interlayer insulating film. Nitrogen is included in the fluorocarbon films.

According to still another aspect of this invention, there is provided a wiring structure comprising an underlayer, an interlayer insulating film which includes a fluorocarbon film formed on the underlayer, and a conductor buried in the interlayer insulating film. The fluorocarbon film contains nitrogen.

According to yet another aspect of this invention, there is provided a method of manufacturing a wiring structure. The method comprises forming an underlayer, forming on the underlayer an interlayer insulating film which includes a fluorocarbon film, and burying a conductor into the interlayer insulating film. Nitrogen is included in the fluorocarbon film.

According to another aspect of this invention, there is provided an electronic device comprising an underlayer, an interlayer insulating film including a fluorocarbon film formed on the underlayer, and a wiring structure buried in the interlayer insulating film. The fluorocarbon film contains nitrogen.

According to still another aspect of this invention, there is provided a method of manufacturing an electronic device.

The method comprises forming an underlayer, forming on the underlayer an interlayer insulating film which includes a fluorocarbon film, and burying a conductor into the interlayer insulating film. Nitrogen is contained in the fluorocarbon film.

BEST MODE FOR EMBODYING THE INVENTION

Prior to description of an embodiment of this invention, an interlayer insulating film structure of a semiconductor device according to the related art will be described in order to facilitate an understanding of this invention.

Figure 1:
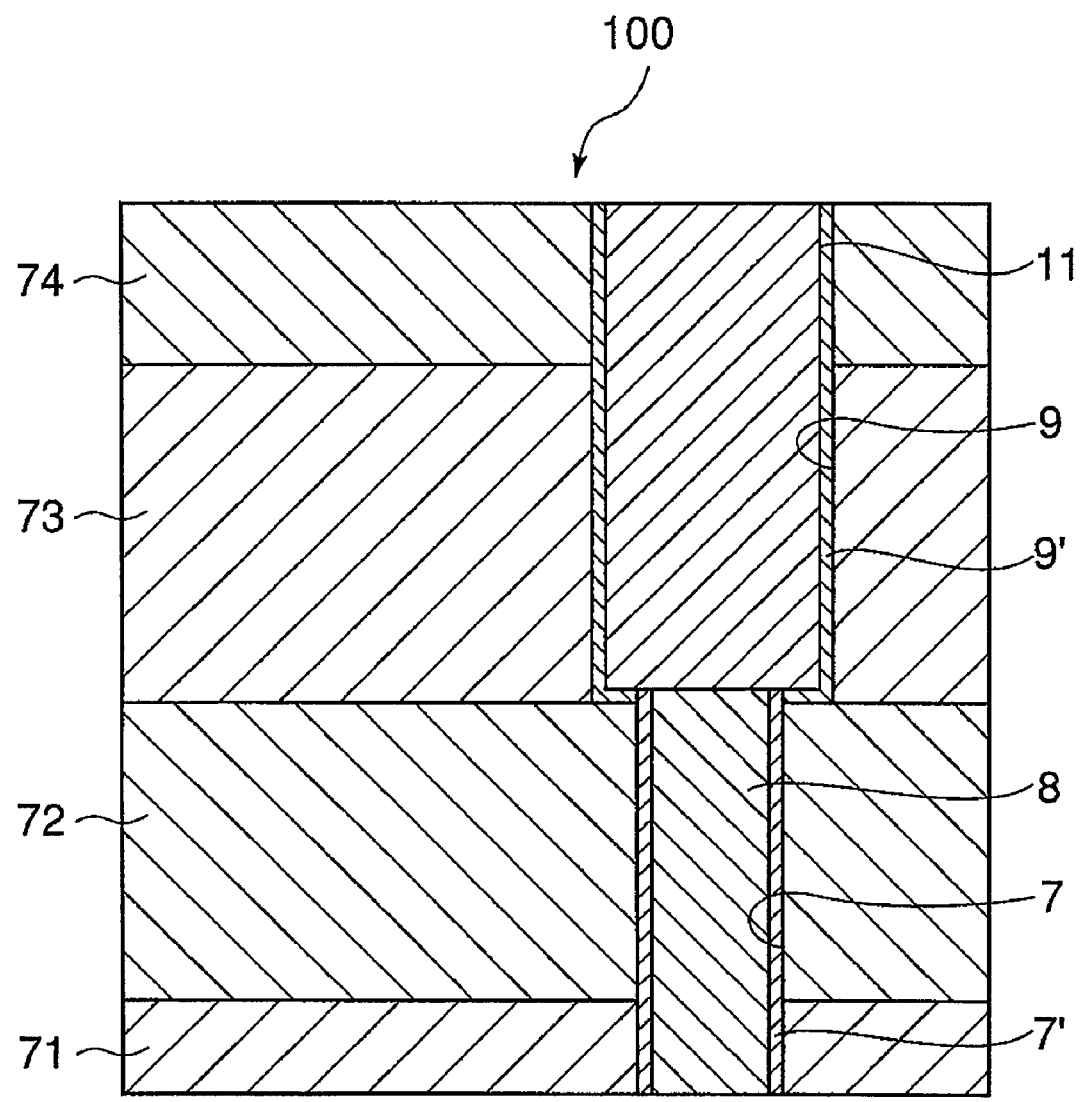
FIG. 1 is a view showing an interlayer insulating film structure of a semiconductor device according to a conventional technique.

FIG. 1 is a view showing the interlayer insulating film structure of the semiconductor device according to the related art. Referring to FIG. 1, in the semiconductor device according to the related art, an interlayer insulating film structure (only one connecting portion between wiring layers is shown) 100 is formed on a semiconductor substrate (not shown) provided with a number of semiconductor elements. The interlayer insulating film structure comprises a barrier cap layer 71 of silicon carbide (SiC) or the like, a carbon-containing silicon oxide (SiOC) film 72 formed on the barrier cap layer 71, a via hole 8 formed in the SiOC film 72, a PAR (low-dielectric-constant silicon (Si)) layer 73, a trench 9 formed in the PAR layer 73, and a hard mask 74 of silicon oxide ($SiO_2$) covering them. A metal such as copper (Cu) is filled in the via hole 8 to form an electrode or a wiring 8. At an upper end of the via hole, Cu or the like is filled in the trench 9 to form a wiring 11.

Next, this invention will be described more in detail.

An interlayer insulating film according to this invention comprises an under layer and a fluorocarbon film formed on the underlayer. The fluorocarbon film contains nitrogen.

Preferably, the above-mentioned underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

Preferably, the fluorocarbon film has a thickness of 50 to 500 nm.

Preferably, the fluorocarbon film has a nitrogen content within a range of 0.5 to 6 atomic %. Preferably, the fluorocarbon film contains F and C in a ratio F/C within a range of 0.8 to 1.1, more preferably 0.8 to 0.9, in an atomic ratio, and contains nitrogen at a ratio of 0.1 to 10 atomic %.

The fluorocarbon film preferably has a dielectric constant k of 1.5 to 2.2, more preferably 1.5 to 2.0.

The above-mentioned fluorocarbon film may be formed by CVD which is performed within at least one kind of gases including C and F together with a gas including N in plasma generated by the use of at least one of an Ar gas, an Xe gas, and a Kr gas.

The gas including N preferably contains one or both of an $N_2$ gas and an $NF_3$ gas.

Preferably, the interlayer insulating film further comprises a layer formed on the fluorocarbon film and formed of one or a plurality of kinds of materials selected from SiCN, SiN, SiCO, $SiO_2$, SiC and hydrocarbon (CH) such as $CH_y$ [y=0.8 to 1.2].

A multilayer wiring structure according to this invention comprises any one of the above-mentioned interlayer insulating films. Preferably, the multilayer wiring structure has at least one of a via and a trench formed in the interlayer insulating film, a conductor layer buried in at least one of the via and the trench, and a barrier layer formed around the conductor layer.

According to this invention, there is provided a method of manufacturing an interlayer insulating film. The method comprises forming an underlayer and forming on the underlayer the interlayer insulating film comprising a fluorocarbon film so that nitrogen is included in the fluorocarbon film.

In the above-mentioned method of manufacturing an interlayer insulating film, the fluorocarbon film preferably contains F and C in a ratio F/C within a range of 0.8 to 1.1 in an atomic ratio and contains nitrogen at a ratio of 0.1 to 10 atomic %. Preferably, the fluorocarbon film contains nitrogen at a ratio of 0.5 to 6 atomic %.

Preferably, the fluorocarbon film has a thickness of 50 to 500 nm.

Preferably, the fluorocarbon film has a dielectric constant k of 1.5 to 2.2. Preferably, the fluorocarbon film has a dielectric constant k of 1.5 to 2.0.

In the above-mentioned method of manufacturing an interlayer insulating film, the underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

In the above-mentioned method of manufacturing an interlayer insulating film, a layer formed of one or a plurality of materials selected from SiCN, SiN, SiCO, $SiO_2$, and hydrocarbon (CH), such as $CH_y$ [y=0.8 to 1.2] is formed on the fluorocarbon film.

In the above-mentioned method of manufacturing an interlayer insulating film, the fluorocarbon film is preferably formed by CVD which is performed within at least one kind of gases including C and F together with a gas including N in plasma generated by the use of at least one of an Ar gas, an Xe gas, and a Kr gas. Preferably, the gas including N contains one or both of an $N_2$ gas and an $NF_3$ gas.

According to this invention, there is provided a method of manufacturing a multilayer wiring structure. The method comprises forming an underlayer, forming on the underlayer an interlayer insulating film which includes a plurality of fluorocarbon films, and burying a metal conductor into the interlayer insulating film. Nitrogen is included in the fluorocarbon films.

Preferably, the fluorocarbon film has a thickness of 50 to 500 nm. Preferably, the fluorocarbon film contains F and C in a ratio F/C within a range of 0.8 to 1.1 in an atomic ratio and contains nitrogen at a ratio of 0.1 to 10 atomic %.

Preferably, the fluorocarbon film contains nitrogen at a ratio of 0.5 to 6 atomic %.

Preferably, the fluorocarbon film has a dielectric constant k of 1.5 to 2.2, more preferably 1.5 to 2.0.

Preferably, the fluorocarbon film is formed by CVD which is performed within at least one kind of gases including C and F together with a gas including N in plasma generated by the use of at least one of an Ar gas, an Xe gas, and a Kr gas. Preferably, the gas including N contains one or both of an $N_2$ gas and an $NF_3$ gas.

In the method of manufacturing a multilayer wiring structure according to this invention, the underlayer may be formed on a base and may comprise at least one of an SiCN layer, an SiN layer, an SiCO layer, an $SiO_2$ layer, an SiC layer, and a hydrocarbon (CH) layer, such as a $CH_y$ layer [y=0.8 to 1.2].

In the above-mentioned method of manufacturing a multilayer wiring structure, it is preferable that a layer formed of one or a plurality of materials selected from SiCN, SiN, SiCO, $SiO_2$, and hydrocarbon (CH), such as $CH_y$ [y=0.8 to 1.2] is formed on the fluorocarbon film.

A wiring structure according to this invention comprises an underlayer, an interlayer insulating film including a fluorocarbon film formed on the underlayer, and a conductor buried in the interlayer insulating film. In the wiring structure, the fluorocarbon film contains nitrogen.

Preferably, the fluorocarbon film has a thickness of 50 to 500 nm. Preferably, the fluorocarbon film contains F and C in a ratio F/C within a range of 0.8 to 1.1 in an atomic ratio and contains nitrogen at a ratio of 0.1 to 10 atomic %.

Preferably, the fluorocarbon film contains nitrogen at a ratio of 0.5 to 6 atomic %.

Preferably, the fluorocarbon film has a dielectric constant k of 1.5 to 2.2, more preferably 1.5 to 2.0.

Preferably, the fluorocarbon film is formed by CVD which is performed within at least one kind of gases including C and F together with a gas including N in plasma generated by the use of at least one of an Ar gas, an Xe gas, and a Kr gas. Preferably, the gas including N contains one or both of an $N_2$ gas and an $NF_3$ gas.

In any one of the above-mentioned wiring structures, the underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

Preferably, the wiring structure further comprises a layer formed on the insulating film and formed of one or a plurality of materials selected from SiCN, SiN, SiCO, $SiO_2$, and hydrocarbon (CH), such as $CH_y$ [y=0.8 to 1.2].

According to this invention, there is provided a method of manufacturing a wiring structure. The method comprises forming an underlayer, forming on the underlayer an interlayer insulating film which includes a fluorocarbon film, and burying a conductor into the interlayer insulating film. Nitrogen is included in the fluorocarbon film.

Preferably, the fluorocarbon film contains F and C in a ratio F/C within a range of 0.8 to 1.1 in an atomic ratio and contains nitrogen at a ratio of 0.1 to 10 atomic %.

Preferably, the fluorocarbon film contains nitrogen at a ratio of 0.5 to 6 atomic %.

Preferably, the fluorocarbon film has a dielectric constant k of 1.5 to 2.2, more preferably 1.5 to 2.0.

Preferably, the fluorocarbon film has a thickness of 50 to 500 nm.

Preferably, the fluorocarbon film is formed by CVD which is performed within at least one kind of gases including C and F together with a gas including N in plasma generated by the use of at least one of an Ar gas, an Xe gas, and a Kr gas. Preferably, the gas including N contains one or both of an $N_2$ gas and an $NF_3$ gas.

In the above-mentioned method of manufacturing a wiring structure, it is preferable that the underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

In the above-mentioned method of manufacturing a wiring structure, it is preferable that a layer formed of one or a plurality of materials selected from SiCN, SiN, SiCO, $SiO_2$, and hydrocarbon (CH), such as $CH_y$ [y=0.8 to 1.2] is formed on the insulating film.

An electronic device according to this invention comprises an underlayer, an interlayer insulating film including a fluorocarbon film formed on the underlayer, and a wiring structure buried in the interlayer insulating film. The fluorocarbon film contains nitrogen.

Preferably, the fluorocarbon film contains F and C in a ratio F/C within a range of 0.8 to 1.1 in an atomic ratio and contains nitrogen at a ratio of 0.1 to 10 atomic %.

Preferably, the fluorocarbon film contains nitrogen at a ratio of 0.5 to 6 atomic %.

Preferably, the fluorocarbon film has a dielectric constant k of 1.5 to 2.2, more preferably 1.5 to 2.0.

Preferably, the fluorocarbon film is formed by CVD which is performed within at least one kind of gases including C and F together with a gas including N in plasma generated by the use of at least one of an Ar gas, an Xe gas, and a Kr gas. Preferably, the gas including N contains one or both of an $N_2$ gas and an $NF_3$ gas.

In the above-mentioned electronic device, it is preferable that the underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

The above-mentioned electronic device further comprises a layer formed on the insulating film and formed of one or a plurality of materials selected from SiCN, SiN, SiCO, $SiO_2$, and hydrocarbon (CH), such as $CH_y$ [y=0.8 to 1.2].

According to this invention, there is provided any one of the above-mentioned electronic devices in which the fluorocarbon film has a thickness of 50 to 500 nm.

According to this invention, there is provided a method of manufacturing an electronic device. The method comprises forming an underlayer, forming on the underlayer an interlayer insulating film which includes a fluorocarbon film, and burying a conductor into the interlayer insulating film. Nitrogen is includes in the fluorocarbon.

Preferably, the fluorocarbon film has a thickness of 50 to 500 nm.

Preferably, the fluorocarbon film contains F and C in a ratio F/C within a range of 0.8 to 1.1 in an atomic ratio and contains nitrogen at a ratio of 0.1 to 10 atomic %.

Preferably, the fluorocarbon film contains nitrogen at a ratio of 0.5 to 6 atomic %.

Preferably, the fluorocarbon film has a dielectric constant k of 1.5 to 2.2, more preferably 1.5 to 2.0.

Preferably, the fluorocarbon film is formed by CVD which is performed within at least one kind of gases including C and F together with a gas including N in plasma generated by the use of at least one of an Ar gas, an Xe gas, and a Kr gas. Preferably, the gas containing N contains one or both of an $N_2$ gas and an $NF_3$ gas.

In the above-mentioned method of manufacturing an electronic device, it is preferable that the underlayer comprising at least one of an SiCN layer, an SiN layer, an SiCO layer, an $SiO_2$ layer, an SiC layer, and a hydrocarbon (CH) layer, such as a $CH_y$ layer [y=0.8 to 1.2], is formed on a base.

In the above-mentioned method of manufacturing an electronic device, it is preferable that a layer formed of one or a plurality of materials selected from SiCN, SiN, SiCO, $SiO_2$, and hydrocarbon (CH), such as $CH_y$ [y=0.8 to 1.2] is formed on the insulating film.

According to this invention described above, it is possible to provide an interlayer insulating film of a semiconductor device, which has a low dielectric constant k not greater than 2.0 and which is stable and to provide a method of manufacturing the same.

According to this invention, it is possible to provide a wiring structure having an interlayer insulating film improved in dielectric breakdown voltage and reduced in leak current and to provide a method of manufacturing the same.

Embodiments

Now, embodiments of this invention will be described with reference to the drawing.

Figure 2:
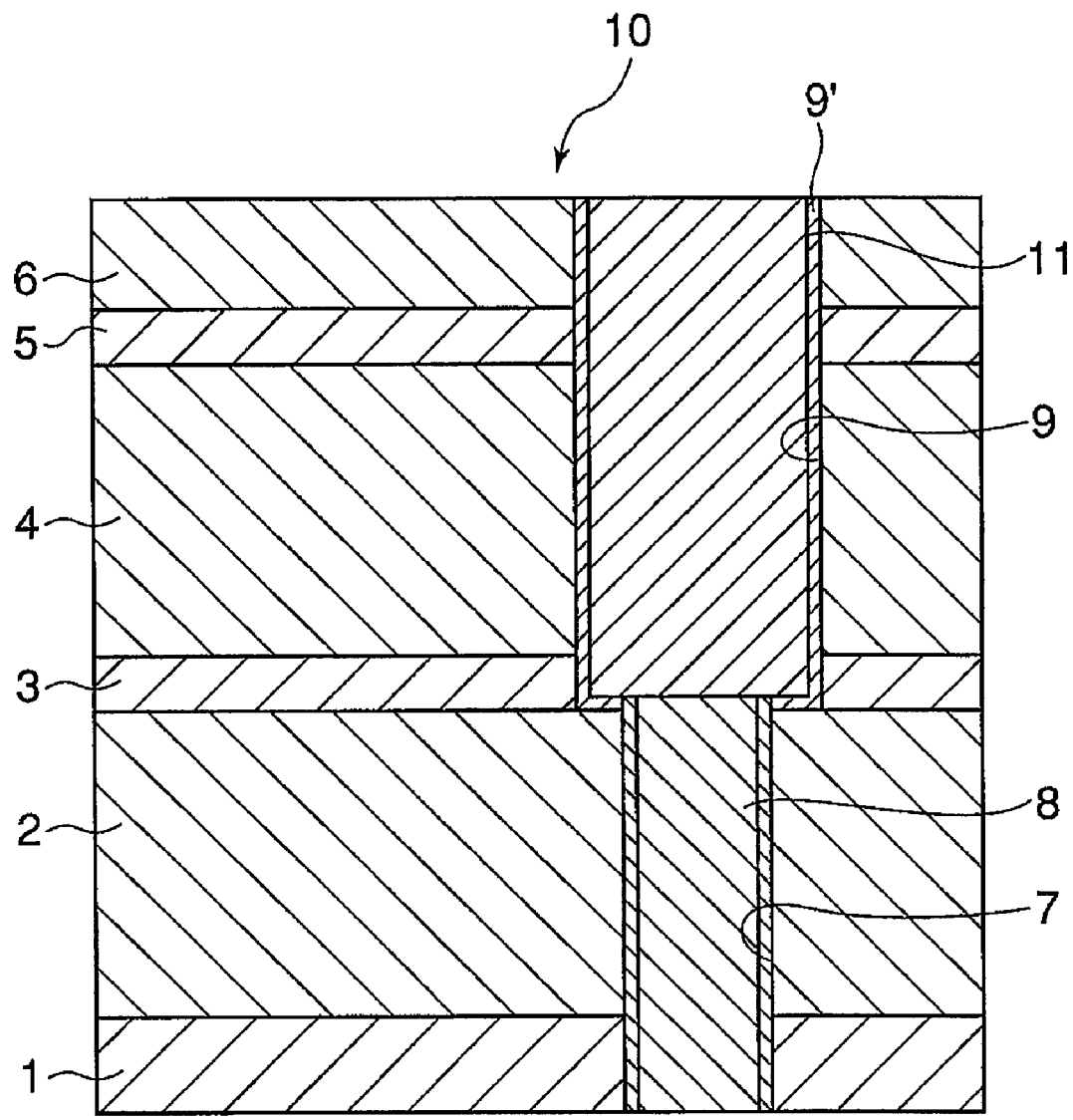
FIG. 2 is a sectional view showing a wiring structure according to an embodiment of this invention.

FIG. 2 is a sectional view showing a wiring structure according to an embodiment of this invention. As illustrated in FIG. 2, in a semiconductor device, a multilayer wiring structure (only one connecting portion between wiring layers is shown) 10 is formed on a semiconductor substrate (not shown) provided with a number of semiconductor elements. The multilayer wiring structure includes a barrier cap layer 1 of silicon carbonitride (SiCN) and an interlayer insulating film 2 formed thereon and comprising a fluorocarbon film (hereinafter referred to as a CFx film).

A via hole 7 is formed to penetrate the interlayer insulating film 2 and the barrier cap layer 1. An electrode or a wiring 8 of Cu is formed in the via hole 7. Furthermore, a second interlayer insulating film 4 comprising a fluorocarbon film is formed on the interlayer insulating film 2 through a first adhesive layer 3 of SiCN. A hard mask 6 of silicon oxide ($SiO_2$) is formed on the second interlayer insulating film 4 through a second adhesive layer 5 of SiCN.

A trench 9 is formed from the hard mask 6 to the interlayer insulating film 2. A wiring conductor 11 of Cu is buried in the trench.

Herein, SiCN of the barrier cap layer 1 and the first and the second adhesive layers 3 and 5 has a dielectric constant of 4.0 to 4.5. However, as the barrier cap layer and the adhesive layers, use may be made of hydrocarbon having k smaller than 3.0. As the adhesive layers, a thinner SiCO film having k=3.0 may be used. As hydrocarbon having k=3.0 or less, an amorphous carbon film (CHy: y=0.8 to 1.2) may be deposited to a thickness of 20 to 30 nm using butyne and Ar plasma. It will readily be understood that, as the barrier cap layer and the adhesive layers, SiN, SiC, $SiO_2$, and the like may be used although the dielectric constant is increased.

The interlayer insulating film comprises a fluorocarbon (CFx) film of k=2.0. Also, a fluorocarbon film of k=about 1.5 may be formed. Such fluorocarbon film may be obtained when nitrogen is contained therein. As the hard mask layer 6, the $SiO_2$ film of k=4.0 is used. Instead, an SiCO film having k smaller than 3.0 may be formed.

The hard mask 6 may be formed by hydrocarbon of k=3.0 or less. For example, hydrocarbon of the type may be the above-mentioned hydrocarbon film.

Figure 3:
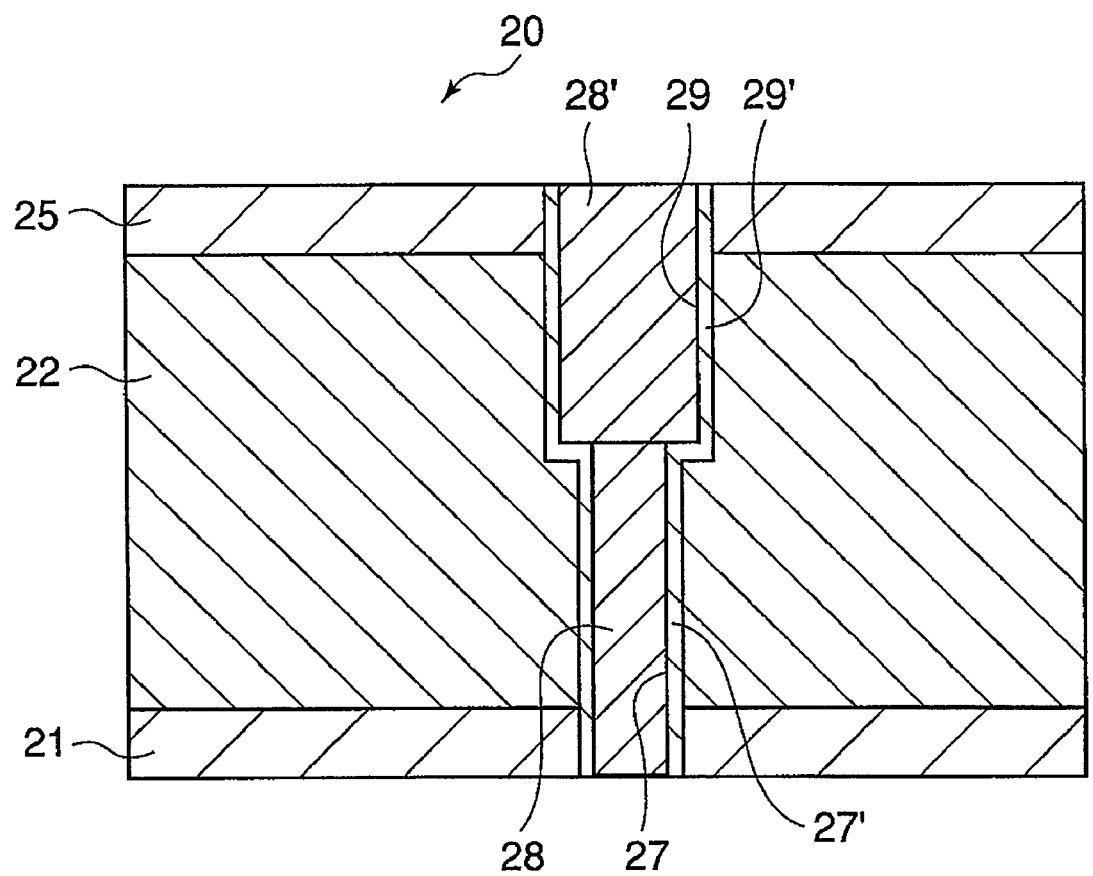
FIG. 3 is a view showing a wiring structure according to another embodiment of this invention.

FIG. 3 is a sectional view showing a simplified multilayer wiring structure according to another embodiment of this invention. As illustrated in FIG. 3, in a semiconductor device, a multilayer wiring structure (only one connecting portion between wiring layers is shown) 20 is formed on a semiconductor substrate (not shown) provided with a number of semiconductor elements. The multilayer wiring structure includes a barrier cap layer 21 comprising a hydrocarbon $CH_y$ layer [y=0.8 to 1.2], an interlayer insulating film 22 formed thereon and comprising a fluorocarbon CFx film [x=0.8 to 1.1], and another barrier layer 25 formed thereon. As the barrier layer 25, a hydrocarbon $CH_y$ layer [y=0.8 to 1.2] is used also. A via hole 27 is formed to penetrate the barrier cap layer 21 and a lower part of the interlayer insulating film 22. An electrode or a wiring 28 of Cu is formed in the via hole 27. A trench 29 is formed through a remaining part (upper part) of the interlayer insulating film 22 and the barrier layer 25. A wiring conductor 28' of Cu is buried in the trench 29. It is noted here that each of the barrier cap layer 21 and the barrier layer 25 comprises the hydrocarbon $CH_y$ layer having k=3.0 or less. The interlayer insulating film 22 comprises the fluorocarbon (CFx)

film having k=2.0 to 1.5. Therefore, a total dielectric constant can significantly be reduced as compared with a conventional structure.

Figure 4:
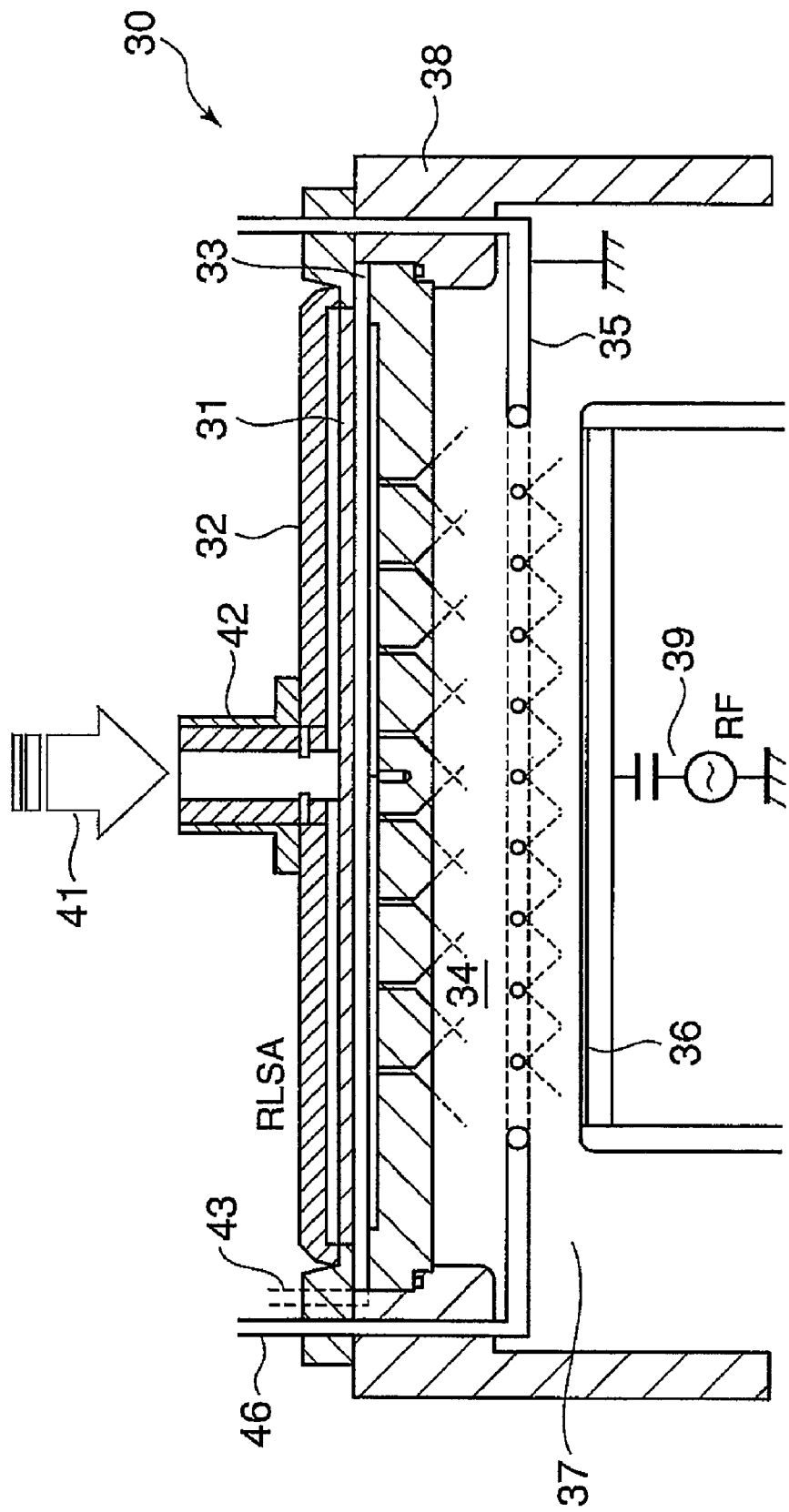
FIG. 4 is a schematic sectional view showing a plasma processing apparatus according to an embodiment of this invention.

FIG. 4 is a schematic sectional view showing a plasma processing apparatus 30 according to an embodiment of this invention. Referring to FIG. 4, a microwave 41 is supplied through a waveguide 42. From a radial line slot antenna (RLSA) 32 which is disposed on an upper part of a chamber wall 38 of the plasma processing apparatus 30 through an insulator plate 31, the microwave is radiated to a plasma generating region 34 through the insulator plate 31 below the antenna and a shower plate 33. As a plasma exciting gas for exciting plasma, a rare gas such as an Ar gas (or a Kr gas, an Xe gas) is supplied through a gas inlet pipe 43 and is uniformly sprayed from the upper shower plate 33 toward the plasma generating region 34. By the microwave radiated thereto, plasma is excited.

In a diffusion plasma region of the microwave-excited plasma processing apparatus 30, a lower shower plate 35 is disposed.

Herein, when an Xe, a Kr or an Ar gas is supplied to the upper shower plate 33 via the inlet pipe 43 and a $SiH_4$ gas is supplied to the lower shower plate 35 via an inlet pipe 46, a silicon ($SiO_2$) film is formed on a surface of a substrate, for example, a silicon wafer 36. When an Xe, a Kr or an Ar gas is supplied through the upper shower plate 33 and a trimethyl silane gas is supplied through the lower shower plate 35, a SiC film is formed. Furthermore, when a Kr, an Xe, or an Ar gas is supplied through the upper shower plate 33 and a $SiH_4$ gas and a $N_2$ gas are supplied through the lower shower plate 35, a SiN film is formed.

When a Kr, an Xe, or an Ar gas is supplied through the upper shower plate 33 and a CxFy ($C_5F_8$, $C_4F_8$, or the like) gas is supplied through the lower shower plate 35, a fluorocarbon film is formed. In this invention, simultaneously with the CxFy gas, a nitrogen-containing gas, for example, at least one of an $N_2$ gas, an $NF_3$ gas, and an $NH_2$ gas is supplied.

An exhaust gas in a processing chamber 37 passes through an exhaust duct via an exhaust port, not shown, to be guided to a pump. In the processing chamber 37, a support table for the substrate, for example, the silicon wafer 36 is connected to a high-frequency (RF) power supply 39.

Next, a CFx film forming process according to an embodiment of this invention will be described in detail.

Referring to FIG. 2, in the CFx film forming process according to the embodiment of this invention, a barrier cap layer 1 of SiCN or SiCO is first formed as an underlayer by plasma treatment using $SiH_4/C_2H_4/N_2$ or $O_2$ or the like. It will readily be understood that organic silane may be used instead of silane gas ($SiH_4$)/ethylene ($C_2H_4$) gas.

Then, as a first interlayer insulating film 2, a CFx film having a thickness of 50 to 500 nm is formed on the barrier cap layer 1 by Ar plasma using a fluorocarbon gas (CFx) as a reactive gas with an $N_2$ gas added thereto.

Herein, as the fluorocarbon gas as the reactive gas, use may be made of unsaturated aliphatic fluoride expressed by a general formula $C_nF_{2n}$ (where n is an integer of 2 to 8) or $CnF_{2n-2}$ (n is an integer of 2 to 8). For example, use may be made of carbon fluoride expressed by a general formula $C_5H_8$, such as carbon fluoride including octafluoropentyne, octafluoropentadiene, octafluorocyclopentene, octafluoromethylbutadiene, octafluoromethylbutyne, fluorocyclopropene, or fluorocyclopropane, or carbon fluoride including fluorocyclobutene or fluorocyclobutane.

Next returning to FIG. 2, description will be made of a method of manufacturing the wiring structure illustrated in the figure.

As shown in FIG. 2, the first interlayer insulating film 2 is formed using the barrier cap layer 1 as the underlayer. A via hole 7 is formed in the first interlayer insulating film 2 by etching. Then, as a barrier layer 7' for preventing diffusion of an electrode metal into the interlayer insulating film, a nickel fluoride film, preferably a nickel difluoride (represented by $NiF_2$) film is formed on an inner wall of the via hole 7 either by forming a nickel film by PVD and then fluorinating the nickel film or directly forming the nickel fluoride film by MOCVD.

Then, in the similar manner, an adhesive layer 3 comprising an SiCN layer or a carbon-containing silicon oxide (SiCO) layer is formed as an underlayer and, thereon, an interlayer insulating film 4 is formed. On the interlayer insulating layer 4, an adhesive layer 5 comprising an SiCN layer or an SiCO layer is further formed as an underlayer and, on the adhesive layer 5, an $SiO_2$ or SiCO layer is formed as a hard mask layer 6. Herein, the $SiO_2$ layer may be formed by introducing a mixed gas of Ar and $O_2$ through the upper shower plate 33 of the plasma processing apparatus 30 illustrated in FIG. 4 and introducing an SiH4 gas through the lower shower plate 22. The SiCO layer may be formed similarly to the underlayer mentioned above.

Then, a trench 9 is formed by etching. On an inner wall surface of the trench 9, a $NiF_2$ barrier 9' is formed. A metal, such as Cu, is filled in the trench 9 to form a wiring conductor 11. Thus, the wiring structure 10 is completed.

Next, a method of manufacturing the wiring structure illustrated in FIG. 3 will be described. In order to manufacture this structure, a barrier cap layer 21, an interlayer insulating film 22, and another barrier layer 25 are successively formed. The successive formation is carried out in the following manner. In the plasma processing apparatus 30 illustrated in FIG. 4, a hydrocarbon $CH_y$ layer 21 is formed by supplying a Xe, a Kr, or an Ar gas to the upper shower plate 33 and supplying a $C_4H_6$ butyne gas through the lower shower plate 35. Next, by switching the gas flowing through the lower shower plate 35 into a mixed gas of $C_5F_8$ gas and a nitrogen gas, a nitrogen-added fluorocarbon film 22 is formed by CVD. Then, by switching the gas flowing through the lower shower plate 35 into a $C_4H_6$ gas, a hydrocarbon $CH_y$ layer 25 is formed by CVD. Subsequently, a via hole 27 is formed which passes through the barrier cap layer 21 and a lower part of the interlayer insulating film 22 while a trench 29 is also formed which passes through a remaining part (upper part) of the interlayer insulating film 22 and the barrier layer 25. Inner walls of the via hole and the trench are coated with barrier layers 27' and 29', respectively, in the manner similar to that mentioned in connection with FIG. 2. The via hole 27 and the trench 29 may be formed in the following manner. The trench 29 is at first formed and then the via hole 27 is bored with a mask of a predetermined thickness applied on an inner wall of the trench. Alternatively, a hole having an inner diameter equal to that of the via hole 27 is formed throughout and then, masking an inside of a part corresponding to the via hole 27, an upper part of the hole is widened to form the trench 29. Thereafter, Cu is filled in the via hole 27 and the trench 29 to form conductors 28 and 28'. Thus, the interlayer wiring structure 20 is completed.

Next, physical properties of the nitrogen-containing interlayer insulating film according to embodiments of this invention will be described more in detail.

Figure 5:
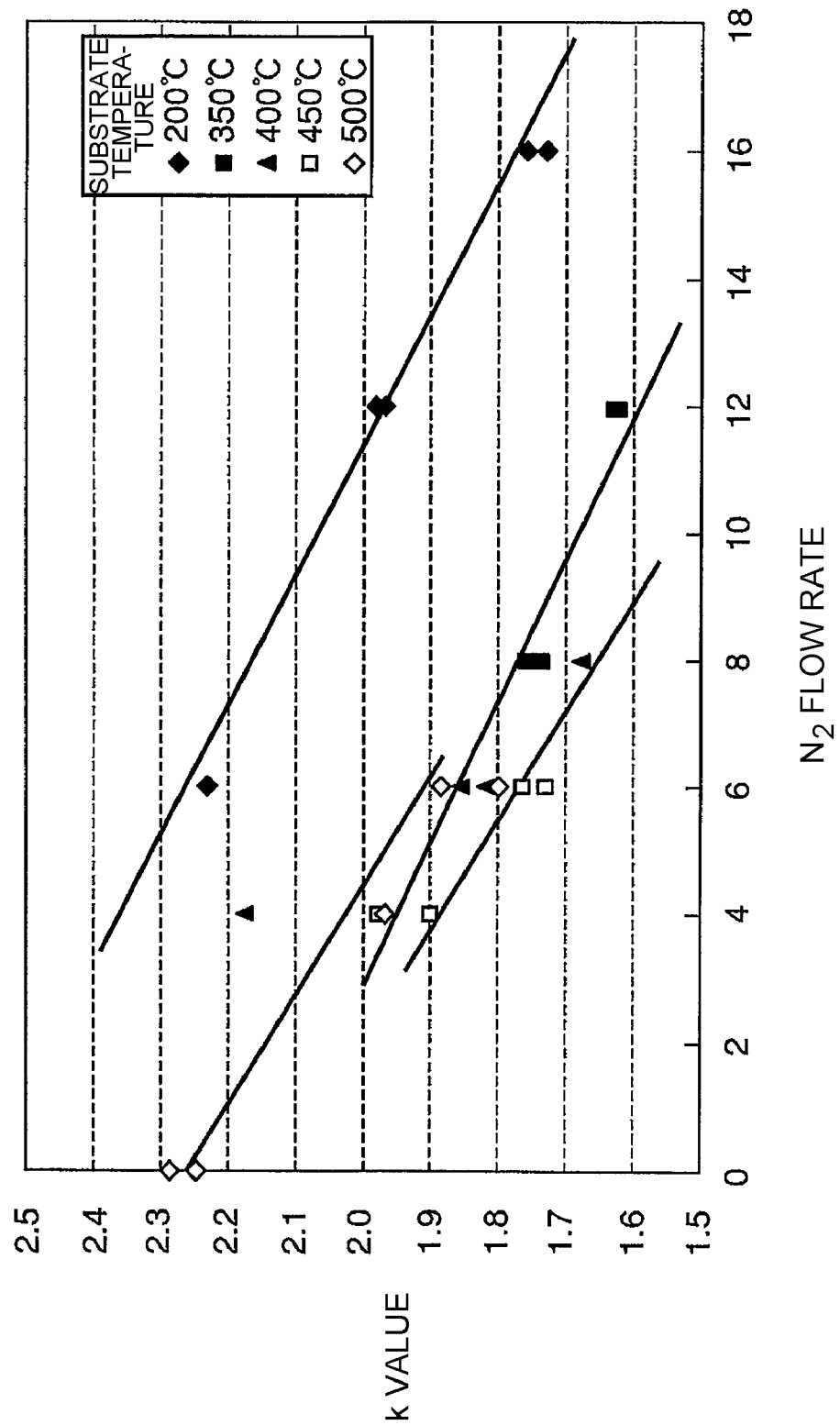
FIG. 5 is a view showing a nitrogen-addition-dependent change in dielectric constant k of an interlayer insulating film according to an embodiment of this invention.

FIG. 5 is a view showing a nitrogen-addition-dependent change of a dielectric constant k of the interlayer insulating film according to an embodiment of this invention. Referring to FIG. 5, CFx films are formed under the following conditions. In this event, the apparatus illustrated in FIG. 4 is used which has a gap of 53 mm between upper and lower electrodes. In the lower shower plate, an opening portion has an aperture ratio of 25%. Under the conditions of 37.24 Pa and 2700 W, $C_5F_8$=50 sccm and Ar=480 sccm are supplied. The figure shows the change in dielectric constant k at a substrate temperature of 200° C., 350° C., 400° C., 450° C., and 500° C. when the flow rate of $N_2$ is changed.

As illustrated in FIG. 5, it has been observed that, with an increase in $N_2$ flow rate (sccm), the k value is linearly decreased to k=1.7 or less and that, when the substrate temperature is elevated, a low k value of k=around 1.6 is obtained at 350° C.

Figure 6:
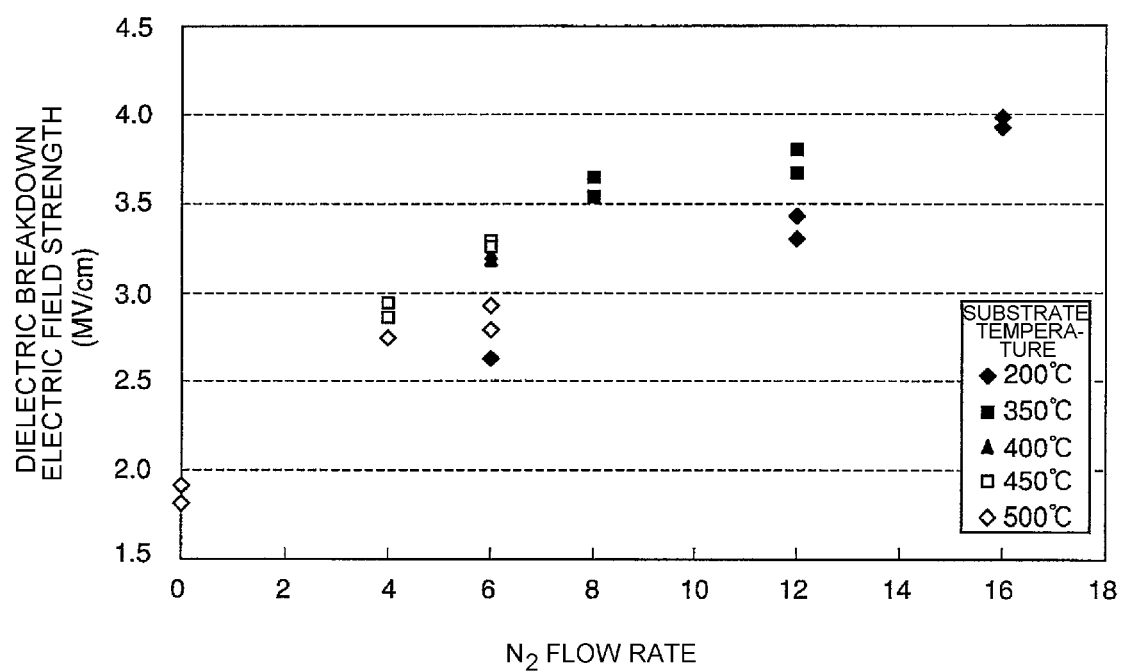
FIG. 6 is a view showing a nitrogen-addition-dependent change in dielectric breakdown electric field strength (MV/cm) of the interlayer insulating film according to an embodiment of this invention.

FIG. 6 is a view showing a nitrogen-addition-dependent change in dielectric breakdown electric field strength (MV/cm) of the interlayer insulating film according to an embodiment of this invention. CFx films exemplified in FIG. 6 are formed under the conditions similar to those illustrated in FIG. 5. As illustrated in FIG. 6, a breakdown voltage without addition of nitrogen is 1.8 to 1.9 MV/cm. On the other hand, at any of the substrate temperatures of 200° C., 350° C., 400° C., 450° C., and 500° C., the breakdown voltage is increased to 2.6 MV/cm or more with an increase of addition of nitrogen. As the $N_2$ flow rate (sccm) is increased, the breakdown voltage characteristic is improved up to 4.0 MV/cm. Thus, it will be understood that the electric characteristic is improved by addition of nitrogen.

Figure 7:
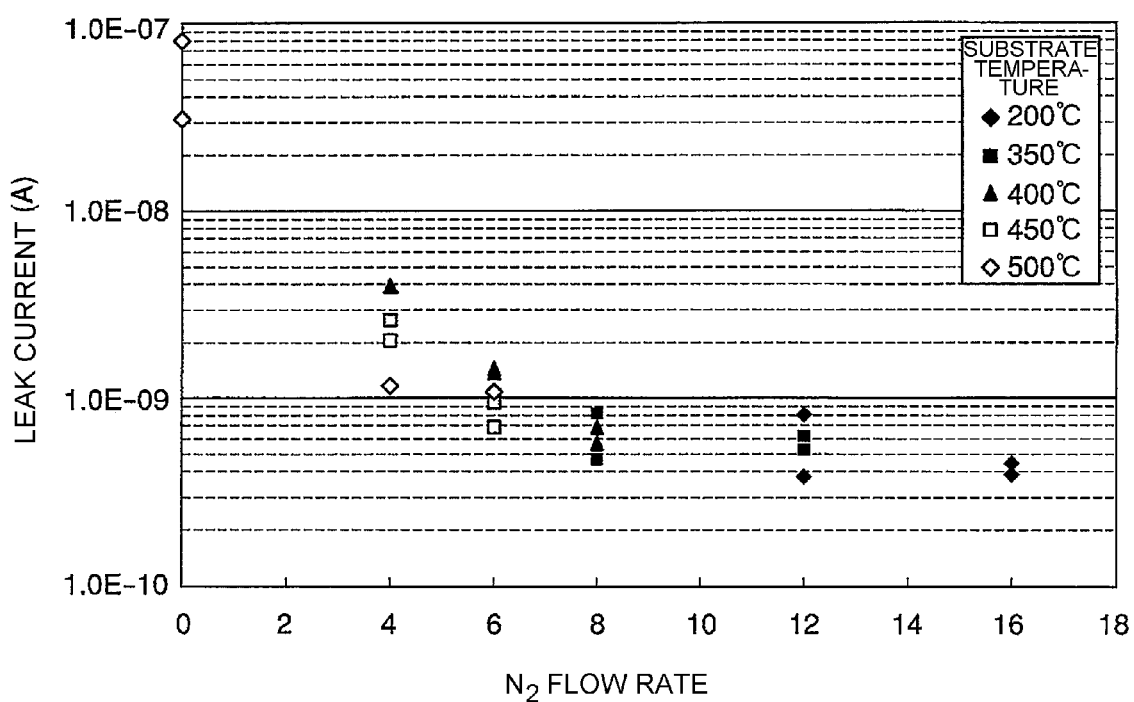
FIG. 7 is a view showing a nitrogen-addition-dependent change in leak current (A) of the interlayer insulating film according to an embodiment of this invention.

FIG. 7 is a view showing a nitrogen-addition-dependent change in leak current (A) of the interlayer insulating film according to an embodiment of this invention. CFx films exemplified in FIG. 7 are formed under the conditions similar to those illustrated in FIG. 5.

Referring to FIG. 7, the leak current without addition of nitrogen is $1.3 \times 10^{-8}$ to $1.8 \times 10^{-8}$ A. On the other hand, at any of the substrate temperatures of 200° C., 350° C., 400° C., 450° C., and 500° C., the leak current is decreased to $1.4 \times 10^{-9}$ A or less with an increase of addition of nitrogen. As the $N_2$ flow rate (sccm) is increased, the leak current is decreased down to $4 \times 10^{-10}$ A. Thus, it will be understood that the electric characteristic is improved by addition of nitrogen.

Figure 8:
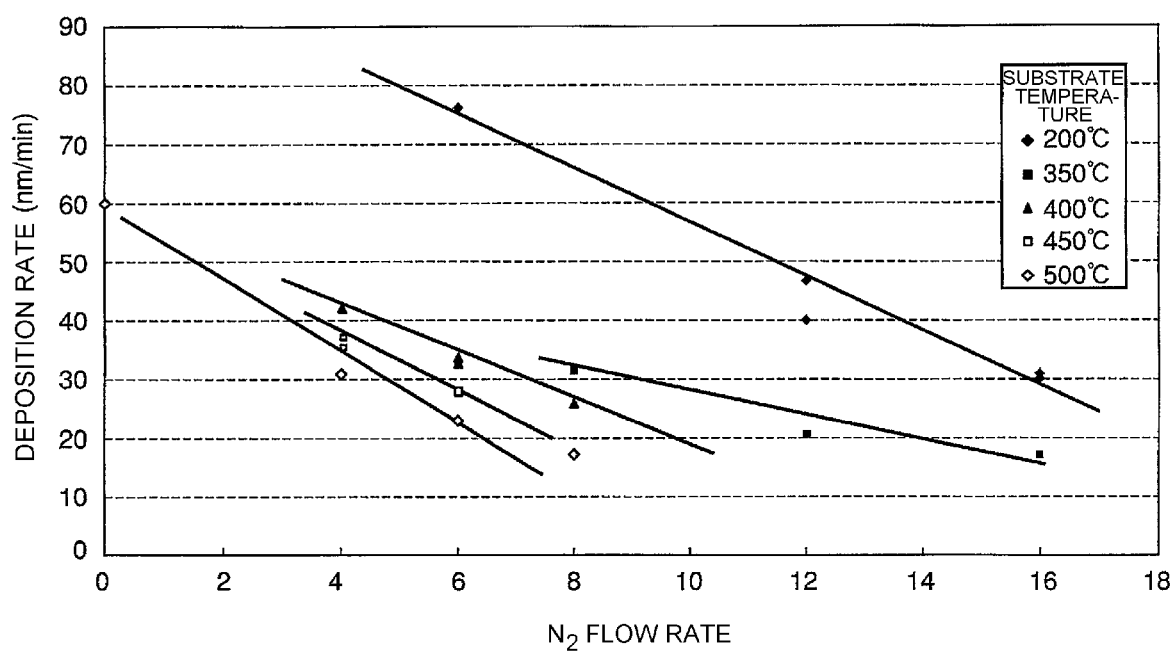
FIG. 8 is a view showing a nitrogen-addition-dependent change in deposition rate (nm/min) of the interlayer insulating film according to an embodiment of this invention.

FIG. 8 is a view showing a nitrogen-addition-dependent change in deposition rate (nm/min) of the interlayer insulating film according to an embodiment of this invention. CFx films exemplified in FIG. 8 are formed under the conditions similar to those illustrated in FIG. 5. As illustrated in FIG. 8, the deposition rate is decreased as the substrate temperature is increased to 200° C., 350° C., 400° C., 450° C., and 500° C. or as the $N_2$ flow rate (sccm) is increased.

Figure 9:
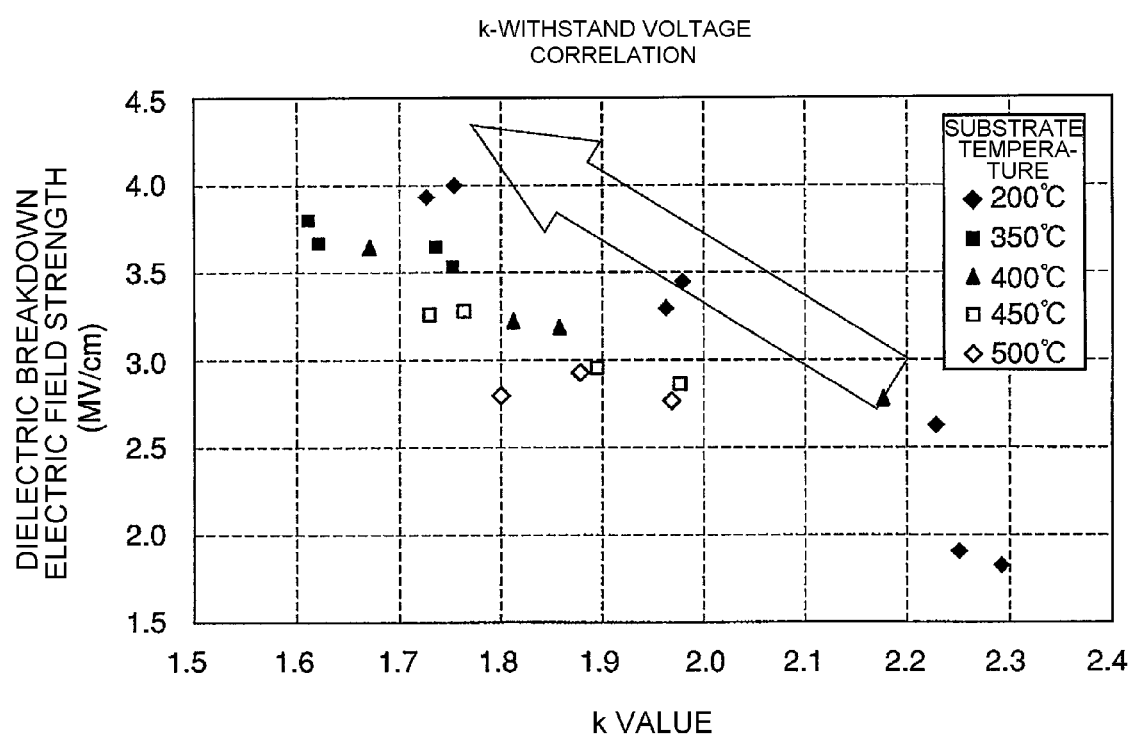
FIG. 9 is a view showing a relationship between a k value and the dielectric breakdown electric field strength (MV/cm) of the interlayer insulating film according to an embodiment of this invention, on the condition that nitrogen is added to the interlayer insulating film.

FIG. 9 is a view showing a relationship between the dielectric constant k value and the dielectric breakdown electric field strength (MV/cm) of the interlayer insulating film according to an embodiment of this invention, on the condition that nitrogen is added to the interlayer insulating film. Referring to FIG. 9, CFx films are formed under the conditions similar to those illustrated in FIG. 5. As illustrated in FIG. 9, at any of the substrate temperatures of 200° C., 350° C., 400° C., 450° C., and 500° C., the breakdown voltage characteristic is improved as the k value is reduced.

The following Table 1 shows a composition ratio of the interlayer insulating film according to an embodiment of this invention, which is dependent on addition of nitrogen.

TABLE 1

| Composition Ratio | | | | (atomic %) | |
|---|---|---|---|---|---|
| Conditions | C | N | O | F | F/C |
| Deposition 200° C., Annealing 350° C., $N_2$: 12 cc | 52.4 | 3.5 | 1.4 | 42.7 | 0.81 |
| Deposition 350° C., Annealing 350° C., $N_2$: 12 cc | 52.7 | 3.5 | 1.6 | 42.2 | 0.80 |
| Deposition 350° C., Annealing 350° C., $N_2$: 18 cc | 50.4 | 4.3 | 1.3 | 44.0 | 0.87 |

As shown in the above Table 1, the composition ratio (F/C (=x)) of the CFx film falls within a range between 0.80 and 0.90 in any of the above-mentioned conditions. If the nitrogen content in the film is 0.1 to 10 atomic %, preferably 0.5 to 6 atomic %, the dielectric constant is effectively reduced. In the examples illustrated in FIGS. 5 to 9, the content of nitrogen is 3 to 5 atomic % in any of the conditions, as shown in the above Table 1.

Referring to FIGS. 10 to 14, characteristics of a nitrogen-containing fluorocarbon film and compositions according to another embodiment of this invention are shown. Nitrogen-containing fluorocarbon films illustrated herein are formed in the following manner. In the apparatus illustrated in FIG. 4, under the conditions of a pressure of 280 mTorr (i.e., 37.2 Pa) and a microwave output of 1500 W, the substrate temperature is kept at 350° C. The flow rate of Ar is 480 sccm while the flow rate of $C_5F_8$ is 50 sccm. An $N_2$ gas, an $NF_3$ gas, or a mixed gas ($N_2/NF_3$=1/1) is used as a nitrogen-containing gas and the flow rate of the nitrogen-containing gas is changed.

Figure 10:
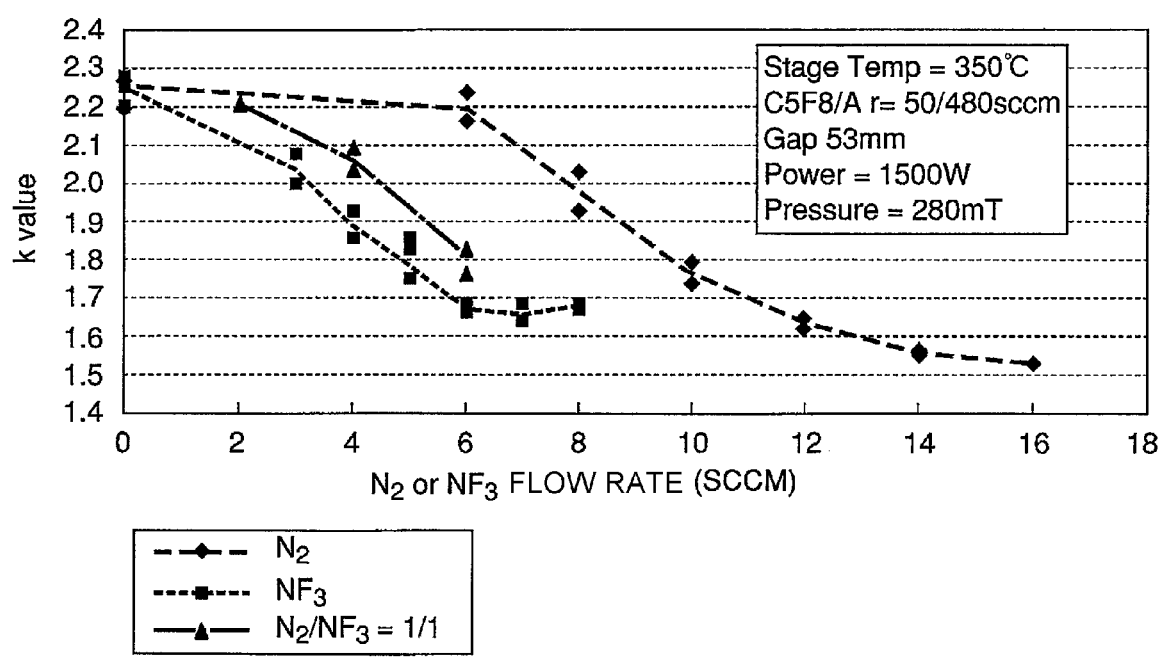
FIG. 10 is a view showing a characteristic and a composition of a nitrogen-containing fluorocarbon film according to another embodiment of this invention.

As illustrated in FIG. 10, it has been observed that a low dielectric constant is obtained at a relatively low flow rate (6 to 8 sccm) when the $NF_3$ gas is used. When the $N_2$ gas is used, a low dielectric constant is not obtained at the above-mentioned flow rate. However, as the flow rate is increased, the low dielectric constant is obtained at the flow rate of 14 to 16 sccm. Using the mixed gas, an intermediate tendency is observed.

Figure 11:
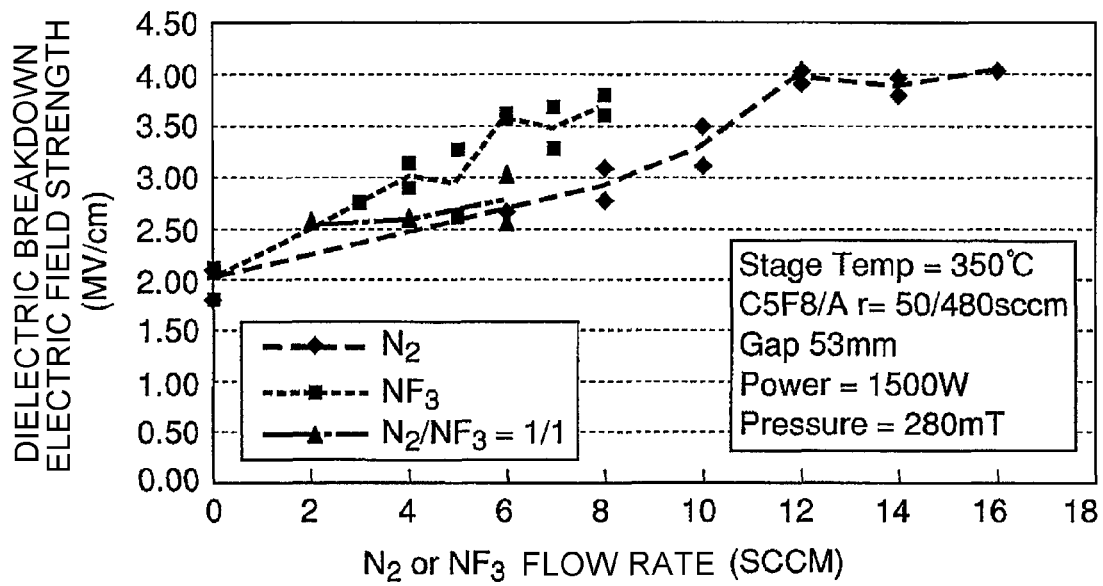
FIG. 11 is a view showing a characteristic and a composition of a nitrogen-containing fluorocarbon film according to another embodiment of this invention.

Referring to FIG. 11, it is understood that a high breakdown voltage (about 3.50 MV/cm) is obtained at a relatively low flow rate (6 to 8 sccm) when the $NF_3$ gas is used. When the $N_2$ gas is used, a high breakdown voltage is not obtained at the above-mentioned flow rate. However, as the flow rate is increased, a higher breakdown voltage is obtained. Using the mixed gas, an intermediate tendency is observed.

Figure 12:
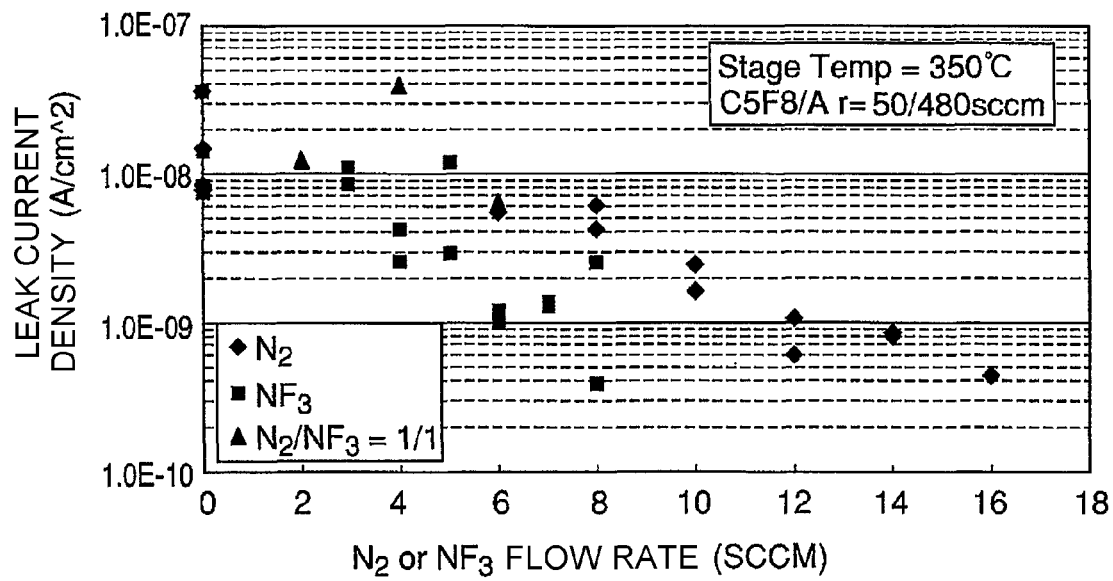
FIG. 12 is a view showing a characteristic and a composition of a nitrogen-containing fluorocarbon film according to another embodiment of this invention.

Referring to FIG. 12, it is understood that a leak current is decreased at a relatively low flow rate (6 to 8 sccm) when the $NF_3$ gas is used. When the $N_2$ gas is used, a low leak current is not obtained at the above-mentioned flow rate. However, as the flow rate is increased, the leak current can be decreased. Using the mixed gas, an intermediate tendency is observed.

Figure 13:
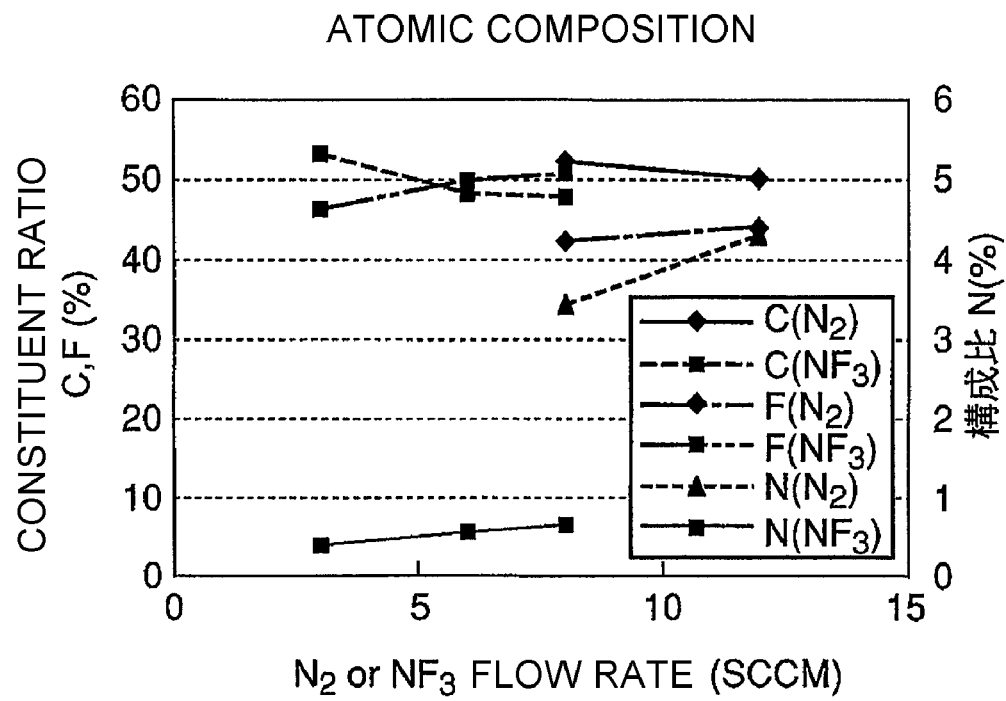
FIG. 13 is a view showing a characteristic and a composition of a nitrogen-containing fluorocarbon film according to another embodiment of this invention.
Figure 14:
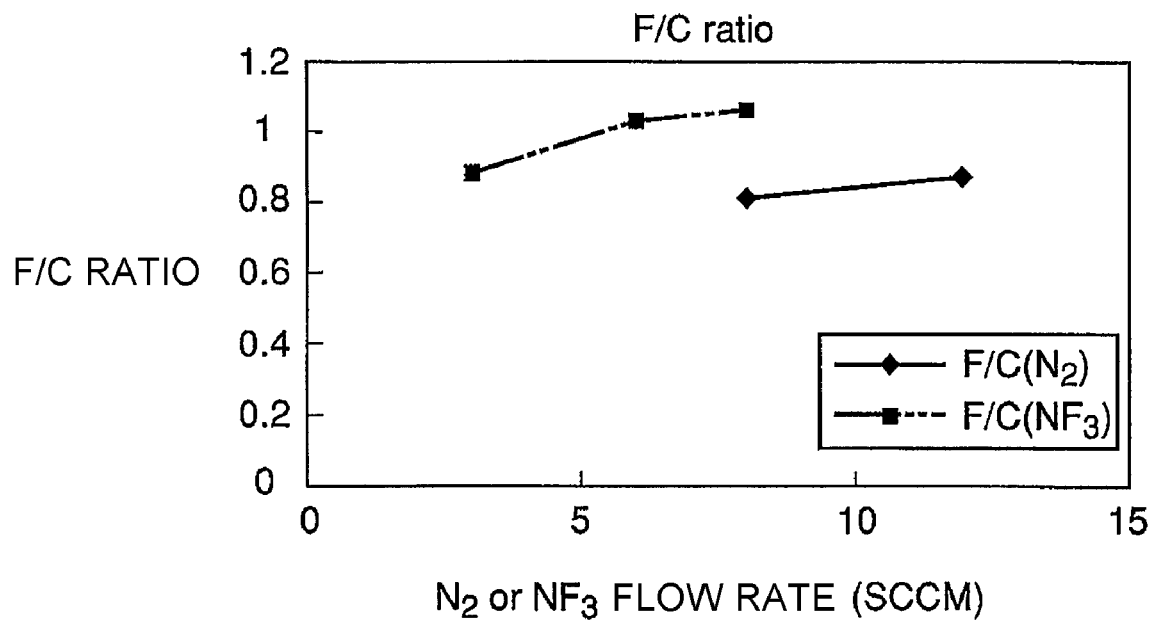
FIG. 14 is a view showing a characteristic and a composition of a nitrogen-containing fluorocarbon film according to another embodiment of this invention.

FIGS. 13 and 14 show results of analysis by an X-ray photoelectron spectrometer (ESCA) for nitrogen-containing fluorocarbon film prepared in the above-mentioned manner and deposited by the use of the $N_2$ gas and the $NF_3$ gas, respectively. FIG. 13 shows an atomic composition, i.e., constituent ratios of C and F (left vertical axis) and a constituent ratio of N (right vertical axis) with respect to the flow rate of each of the $N_2$ gas and the $NF_3$ gas. FIG. 14 shows the F/C ratio with respect to the flow rate of each of $N_2$ gas and the $NF_3$ gas. Referring to FIG. 13, when deposition is performed using the $N_2$ gas, the atomic % of C is slightly greater than 50 and the atomic % of F is about 44. The ratio of N is increased as the gas flow rate is increased and, when the gas flow rate is 12 sccm, about 4.3 atomic % is contained in the film. In case where deposition is performed using the $NF_3$ gas, the atomic % of F is increased to a value slightly greater than 50 as the flow rate is increased. Therefore, the atomic % of C is decreased from a value slightly greater than 50 to less than 50 as the flow rate is increased. The amount of N contained in the film is as small as about 0.5 atomic %. Referring to FIG. 14, when deposition is performed using the $N_2$ gas, the F/C ratio is about 0.8 to 0.85. When deposition is performed using the $NF_3$ gas, the F/C ratio is increased to about 1.04.

Figure 15A:
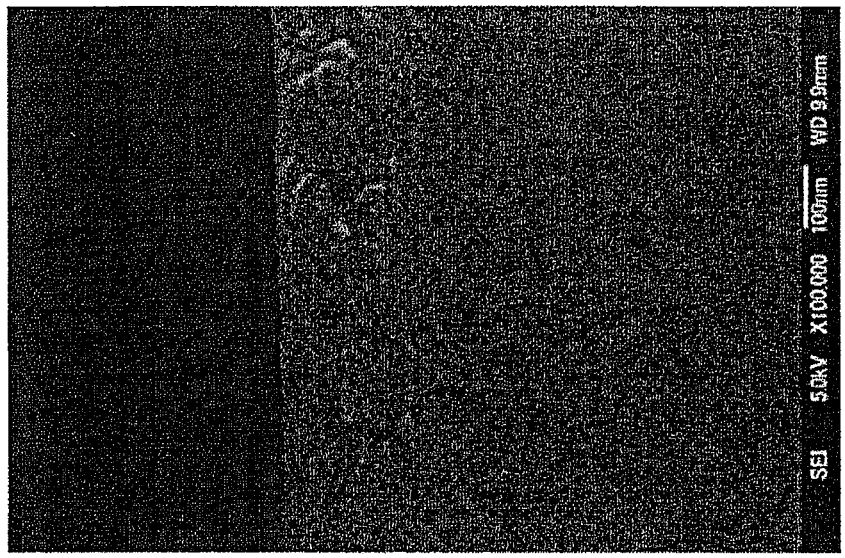
FIG. 15A is a cross section SEM photograph of a CF film deposited on Si without supplying an $NF_3$ gas (0 cc) under conditions shown in FIGS. 10 to 14 except that a pressure is kept at 200 mTorr (26.6 Pa).
Figure 15B:
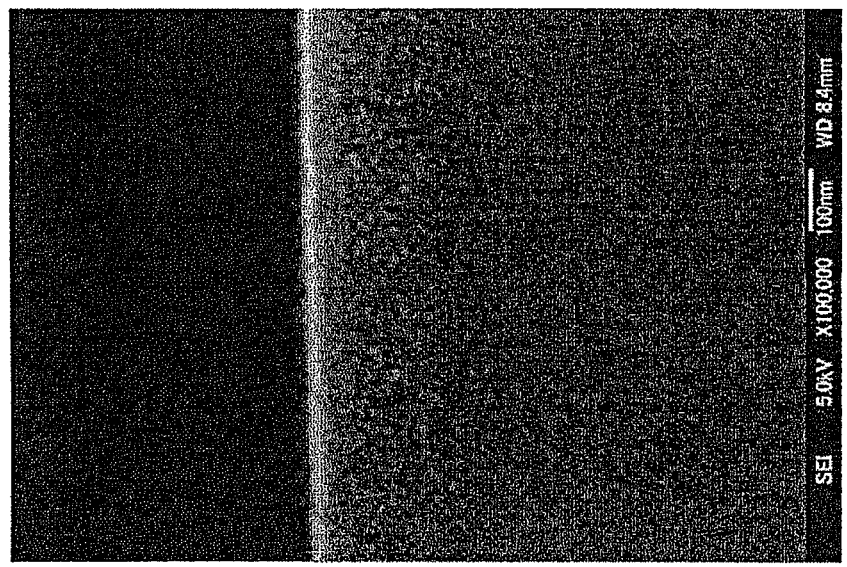
FIG. 15B is a cross section SEM photograph of a CF film deposited on Si without supplying an $NF_3$ gas (0 cc) under the conditions shown in FIGS. 10 to 14 except that a pressure is kept at 400 mTorr (53.2 Pa).
Figure 16A:
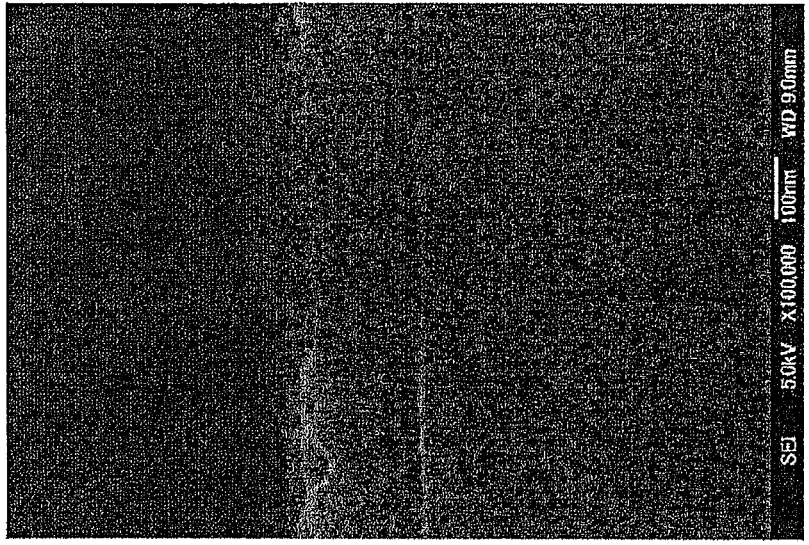
FIG. 16A is a cross section SEM photograph of a CF film deposited on Si with an $NF_3$ gas of 7 cc supplied under the conditions shown in FIGS. 10 to 14 except that a pressure is kept at 200 mTorr (26.6 Pa).
Figure 16B:
FIG. 16B is a cross section SEM photograph of a CF film deposited on Si with an $NF_3$ gas of 7 cc supplied under the conditions shown in FIGS. 10 to 14 except that a pressure is kept at 400 mTorr (53.2 Pa).
Figure 17:
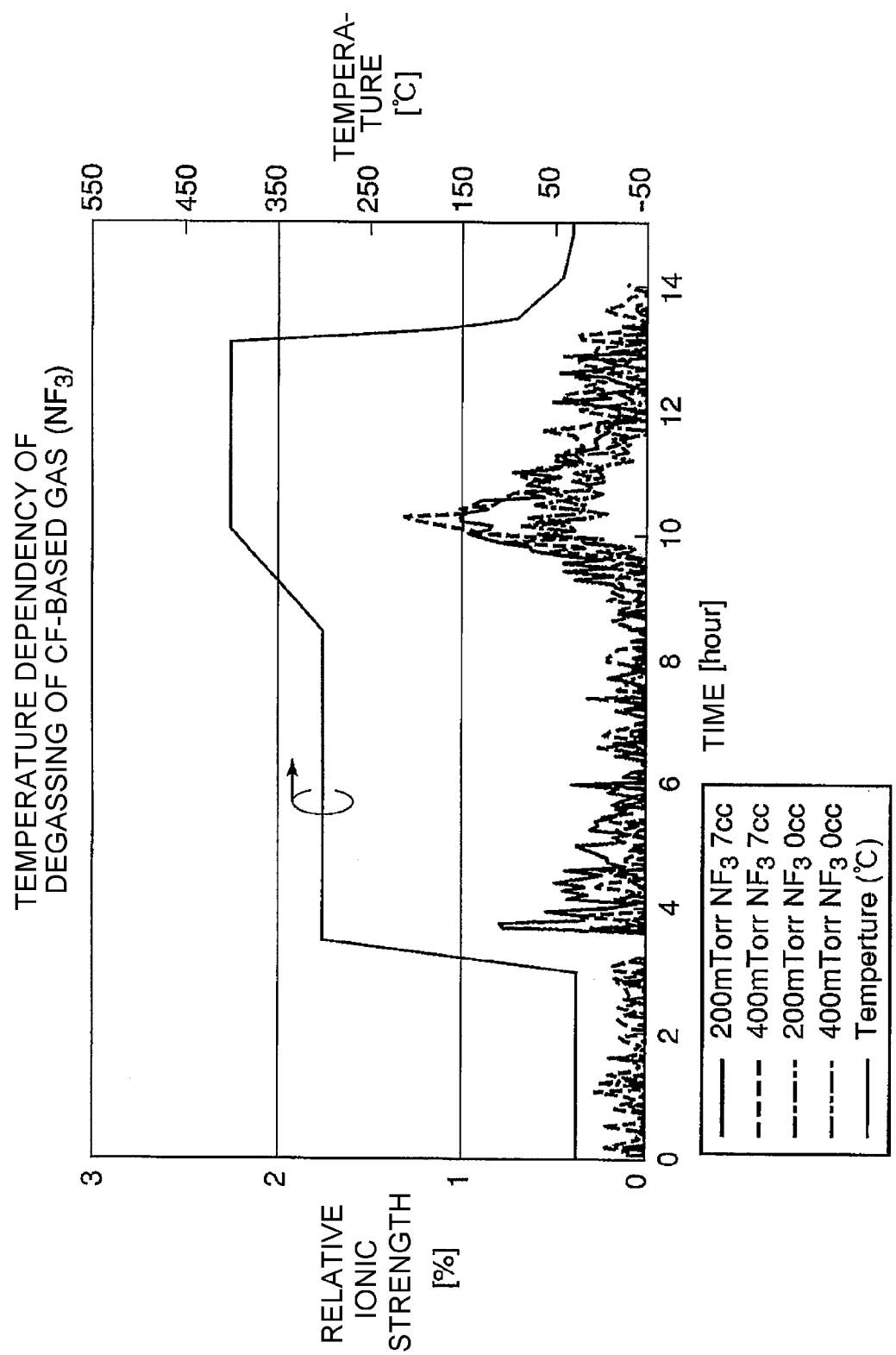
FIG. 17 is a view showing a temperature (right vertical axis) and a degassing degree after deposition with an $NF_3$ gas of 7 cc supplied and without supplying the gas under the conditions shown in FIGS. 10 to 14 except that a pressure is kept at 200 mTorr (26.6 Pa) and 400 mTorr (53.2 Pa).

FIGS. 15 to 17 show results in case where the $NF_3$ gas is not supplied and 7 cc is supplied under the above-mentioned conditions except that a pressure is kept at 200 mTorr (=26.6 Pa) and 400 mTorr (=53.2 Pa). FIG. 15 is a cross section SEM photograph of a CF film deposited on Si when $NF_3$ is not supplied.

FIG. 16 is a cross section SEM photograph of a CF film deposited on Si when $NF_3$ of 7 cc is supplied.

FIG. 17 is a view showing a degree of degassing from the film when, after deposition, the temperature (right vertical axis) is increased along a profile shown in the figure. When $NF_3$ is supplied, degassing is slightly increased as compared with the case where no $NF_3$ is supplied.

Figure 18:
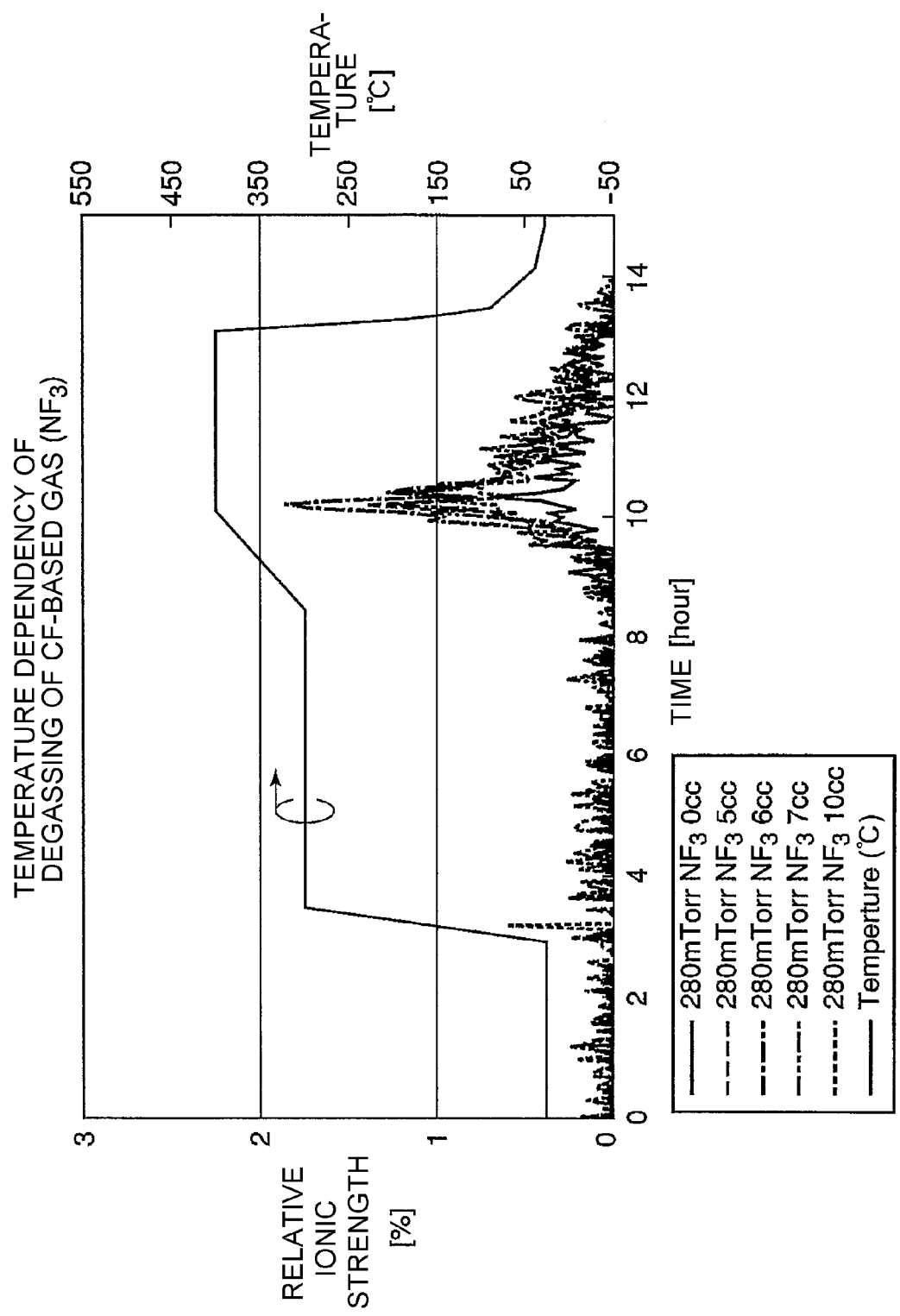
FIG. 18 is a view, similar to FIG. 17, showing a degassing degree from a CF film deposited under the conditions similar to those in FIGS. 10 to 14 in the cases where the flow rate of the $NF_3$ gas is changed and where an $N_2$ gas is supplied.
Figure 19:
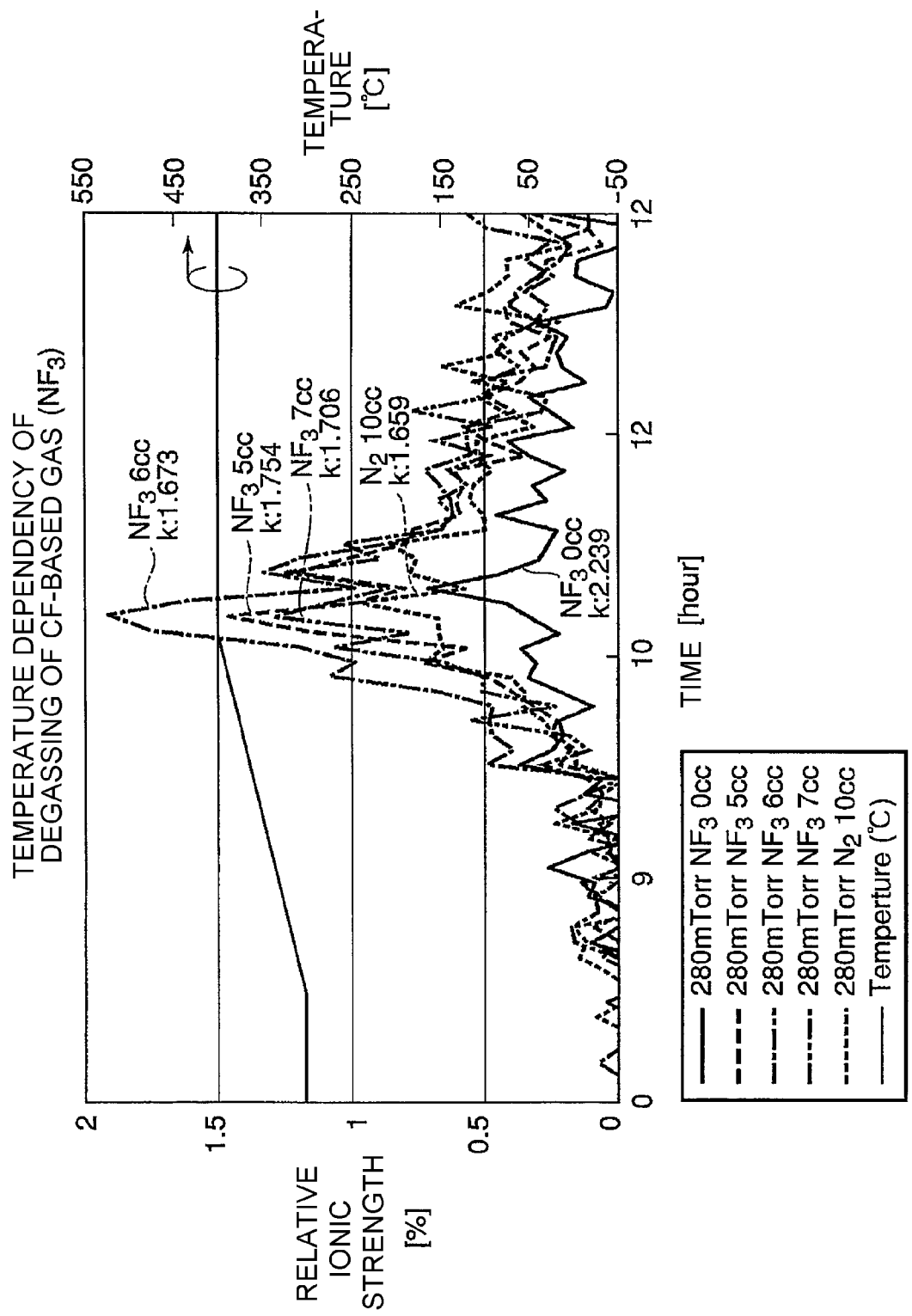
FIG. 19 is an enlarged view of a part in FIG. 18.

FIG. 18 shows, similarly to FIG. 17, degassing from CF films deposited under the same conditions as those in FIGS. 10 to 14 and shows the cases where the flow rate of the $NF_3$ gas is changed and where the $N_2$ gas is supplied. FIG. 19 is an enlarged view of a part of FIG. 18. From these figures, it is understood that degassing is smallest when the $N_2$ gas of 10 cc is supplied.

INDUSTRIAL APPLICABILITY

As described above, the interlayer insulating film comprising the CFx film, the method of manufacturing the same, the wiring structure, and the method of manufacturing the same according to this invention are most suitable for a semiconductor device including an interlayer insulating film having a low dielectric constant, a high breakdown voltage, and a low leak current and a wiring structure, a wiring board, and an electronic device including the same.

This application claims the benefit of priority based on Japanese Patent Application No. 2006-304534 filed on Nov. 9, 2006 and Japanese Patent Application No. 2007-38584 filed on Feb. 19, 2007, disclosures of which are incorporated herein by reference.

The invention claimed is:

1. A wiring structure comprising:
an underlayer;
an interlayer insulating film including a fluorocarbon film formed on the underlayer; and
a conductor buried in the interlayer insulating film;
wherein the fluorocarbon film contains nitrogen; and
wherein the fluorocarbon film contains F and C in a ratio F/C within a range of 0.8 to 1.1 in an atomic ratio and contains nitrogen at a ratio of 0.1 to 10 atomic %.

2. A wiring structure comprising:
an underlayer;
an interlayer insulating film including a fluorocarbon film formed on the underlayer; and
a conductor buried in the interlayer insulating film;
wherein the fluorocarbon film contains nitrogen;
wherein the fluorocarbon film is formed by CVD which is performed within at least one kind of gases including C and F together with a gas including N in plasma generated by the use of at least one of an Ar gas, an Xe gas, and a Kr gas; and wherein the gas including N contains one or both of an $N_2$ gas and an $NF_3$ gas.

3. The wiring structure according to claim 1, wherein the fluorocarbon film has a dielectric constant k of 1.5 to 2.2.

4. The wiring structure according to claim 3, wherein the fluorocarbon film has a dielectric constant k of 1.5 to 2.0.

5. The wiring structure according to claim 1, wherein the underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

6. The wiring structure according to claim 1, further comprising a layer formed on the insulating film and formed of one or a plurality of materials selected from SiCN, SiN, SiCO, $SiO_2$, and hydrocarbon (CH), such as $CH_y$ [y=0.8 to 1.2].

7. A wiring structure comprising:
an underlayer;
an interlayer insulating film including a fluorocarbon film formed on the underlayer; and
a conductor buried in the interlayer insulating film;
wherein the fluorocarbon film contains nitrogen and has a thickness of 50 to 500 nm.

8. The wiring structure according to claim 2, wherein the fluorocarbon film contains nitrogen at a ratio of 0.5 to 6 atomic %.

9. The wiring structure according to claim 7, wherein the fluorocarbon film has a dielectric constant k of 1.5 to 2.2.

10. The wiring structure according to claim 9, wherein the fluorocarbon film has a dielectric constant k of 1.5 to 2.0.

11. The wiring structure according to claim 7, wherein the underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

12. The wiring structure according to claim 7, further comprising a layer formed on the insulating film and formed of one or a plurality of materials selected from SiCN, SiN, SiCO, $SiO_2$, and hydrocarbon (CH), such as $CH_y$ [y=0.8 to 1.2].

13. The wiring structure according to claim 2, wherein the fluorocarbon film has a dielectric constant k of 1.5 to 2.2.

14. The wiring structure according to claim 13, wherein the fluorocarbon film has a dielectric constant k of 1.5 to 2.0.

15. The wiring structure according to claim 2, wherein the underlayer is formed on a base and comprises at least one of an SiCN layer, an SiN layer, an SiCO layer, an $SiO_2$ layer, an SiC layer, and a hydrocarbon (CH) layer, such as a $CH_y$ layer [y=0.8 to 1.2].

16. The wiring structure according to claim 2, further comprising a layer formed on the insulating film and formed of one or a plurality of materials selected from SiCN, SiN, SiCO, $SiO_2$, and hydrocarbon (CH), such as $CH_y$ [y=0.8 to 1.2].

* * * * *

UNITED STATES PATENT AND TRADEMARK OFFICE
CERTIFICATE OF CORRECTION

PATENT NO. : 7,923,819 B2
APPLICATION NO. : 12/514173
DATED : April 12, 2011
INVENTOR(S) : Tadahiro Ohmi et al.

It is certified that error appears in the above-identified patent and that said Letters Patent is hereby corrected as shown below:

Title page, under item (73) Assignees, please change "National Iniversity Corporation Tohoku University" to -- National University Corporation Tohoku University --

Signed and Sealed this
Seventeenth Day of January, 2012

David J. Kappos
*Director of the United States Patent and Trademark Office*